(12) United States Patent
Kang et al.

(10) Patent No.: US 11,818,877 B2
(45) Date of Patent: Nov. 14, 2023

(54) THREE-DIMENSIONAL DYNAMIC RANDOM ACCESS MEMORY (DRAM) AND METHODS OF FORMING THE SAME

(71) Applicant: Applied Materials, Inc., Santa Clara, CA (US)

(72) Inventors: Chang Seok Kang, San Jose, CA (US); Tomohiko Kitajima, San Jose, CA (US); Sung-Kwan Kang, Santa Clara, CA (US); Fredrick Fishburn, Aptos, CA (US); Gill Yong Lee, Santa Clara, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 127 days.

(21) Appl. No.: 17/486,631

(22) Filed: Sep. 27, 2021

(65) Prior Publication Data

US 2023/0096309 A1 Mar. 30, 2023

Related U.S. Application Data

(60) Provisional application No. 63/108,612, filed on Nov. 2, 2020.

(51) Int. Cl.
*H10B 12/00* (2023.01)

(52) U.S. Cl.
CPC .............. *H10B 12/05* (2023.02); *H10B 12/03* (2023.02); *H10B 12/30* (2023.02)

(58) Field of Classification Search
CPC ......... H10B 12/03; H10B 12/05; H10B 12/30
See application file for complete search history.

(56) References Cited

U.S. PATENT DOCUMENTS

| 4,811,067 A | 3/1989 | Fitzgerald et al. |
| 4,894,697 A | 1/1990 | Chin et al. |

(Continued)

FOREIGN PATENT DOCUMENTS

| EP | 905772 A2 | 3/1999 |
| JP | 2013045894 A | 3/2013 |

(Continued)

OTHER PUBLICATIONS

PCT Int'l Application No. PCT/US2021/052222, International Search Report and Written Opinion dated Jan. 14, 2022, 9 pages.

*Primary Examiner* — Mohammad M Hoque
*Assistant Examiner* — Kevin Quinto
(74) *Attorney, Agent, or Firm* — PATTERSON & SHERIDAN, LLP

(57) ABSTRACT

Examples herein relate to three-dimensional (3D) dynamic random access memory (DRAM) and corresponding methods. In an example, a film stack is formed on a substrate. The film stack includes multiple unit stacks, each having, sequentially, a first dielectric layer, a semiconductor layer, and a second dielectric layer. A first opening is formed through the film stack. The second dielectric layer is pulled back from the first opening forming a first lateral recess. A gate structure is formed in the first lateral recess and disposed on a portion of the semiconductor layer. A second opening, laterally disposed from where the first opening was formed, is formed through the film stack. The portion of the semiconductor layer is pulled back from the second opening forming a second lateral recess. A capacitor is formed in a region where the second lateral recess was disposed and contacting the portion of the semiconductor layer.

18 Claims, 10 Drawing Sheets

(56) References Cited

U.S. PATENT DOCUMENTS

| | | |
|---|---|---|
| 5,034,787 A | 7/1991 | Dhong et al. |
| 5,160,987 A | 11/1992 | Pricer et al. |
| 5,164,917 A | 11/1992 | Shichijo |
| 5,177,576 A | 1/1993 | Kimura et al. |
| 5,208,172 A | 5/1993 | Fitch et al. |
| 5,214,603 A | 5/1993 | Dhong et al. |
| 5,363,327 A | 11/1994 | Henkles et al. |
| 5,429,977 A | 7/1995 | Lu et al. |
| 5,497,017 A | 3/1996 | Gonzales |
| 5,792,685 A | 8/1998 | Hammerl et al. |
| 5,929,477 A | 7/1999 | McAllister Burns, Jr. et al. |
| 5,977,579 A | 11/1999 | Noble |
| 6,044,009 A | 3/2000 | Goebel et al. |
| 6,107,133 A | 8/2000 | Furukawa et al. |
| 6,137,128 A | 10/2000 | Tolmes et al. |
| 6,288,422 B1 | 9/2001 | Mandelman et al. |
| 6,576,945 B2 | 6/2003 | Mandelman et al. |
| 6,579,759 B1 | 6/2003 | Chudzik |
| 6,583,462 B1 | 6/2003 | Furukawa |
| 6,593,614 B1 | 7/2003 | Hofmann et al. |
| 6,624,033 B2 | 9/2003 | Noble |
| 6,630,379 B2 | 10/2003 | Mandelman |
| 6,660,581 B1 | 12/2003 | Yang |
| 6,680,864 B2 | 1/2004 | Noble |
| 6,727,141 B1 | 4/2004 | Bronner et al. |
| 6,727,539 B2 | 4/2004 | Divakaruni et al. |
| 6,727,540 B2 | 4/2004 | Divakaruni |
| 6,750,097 B2 | 6/2004 | Divakaruni et al. |
| 6,809,368 B2 | 10/2004 | Divakaruni et al. |
| 6,884,676 B2 | 4/2005 | Arnold et al. |
| 6,906,372 B2 | 6/2005 | Yamada et al. |
| 6,998,666 B2 | 2/2006 | Beintner et al. |
| 7,042,040 B2 | 5/2006 | Horiguchi |
| 7,365,385 B2 | 4/2008 | Abbott |
| 7,485,910 B2 | 2/2009 | Kim et al. |
| 7,781,285 B2 | 8/2010 | Kim et al. |
| 7,795,659 B2 | 9/2010 | Yoon et al. |
| 7,960,780 B2 | 6/2011 | Son et al. |
| 8,114,757 B1 | 2/2012 | Or-Bach et al. |
| 8,383,477 B2 | 2/2013 | Lee |
| 8,637,912 B1 | 1/2014 | Park |
| 9,177,872 B2 | 11/2015 | Sandhu |
| 9,466,614 B2 | 10/2016 | Barth, Jr. et al. |
| 10,347,637 B2 | 7/2019 | Sandhu |
| 10,418,374 B2 | 9/2019 | Lee et al. |
| 10,438,802 B2 | 10/2019 | Park et al. |
| 10,468,414 B2 | 11/2019 | Kim et al. |
| 10,475,697 B2 | 11/2019 | Ramaswamy |
| 10,636,479 B2 | 4/2020 | Ikeda et al. |
| 10,672,456 B2 | 6/2020 | Fishburn et al. |
| 10,790,008 B2 | 9/2020 | Koya |
| 10,854,612 B2 | 12/2020 | Cho et al. |
| 10,943,953 B2 | 3/2021 | Karda et al. |
| 10,950,295 B2 | 3/2021 | Tanaka et al. |
| 11,017,843 B2 | 5/2021 | Sharma et al. |
| 11,018,137 B2 | 5/2021 | Hwang et al. |
| 11,043,499 B2 | 6/2021 | Tang et al. |
| 11,062,751 B2 | 7/2021 | Cho et al. |
| 11,094,699 B1 | 8/2021 | Brewer et al. |
| 11,107,819 B2 | 8/2021 | Sandhu |
| 11,164,872 B1 | 11/2021 | Pulugurtha et al. |
| 11,195,578 B2 | 12/2021 | Pillarisetty et al. |
| 11,195,836 B2 | 12/2021 | Kim et al. |
| 11,195,839 B2 | 12/2021 | Pillarisetty et al. |
| 11,227,864 B1 | 1/2022 | Saeedi Vahdat et al. |
| 11,239,117 B1 | 2/2022 | Saeedi Vahdat et al. |
| 11,257,822 B2 | 2/2022 | Gomes et al. |
| 11,282,572 B2 | 3/2022 | Chiang et al. |
| 2006/0197131 A1 | 9/2006 | Yoon et al. |
| 2009/0159947 A1 | 6/2009 | Kim et al. |
| 2019/0074277 A1 | 3/2019 | Ramaswamy |
| 2019/0164985 A1 | 5/2019 | Lee et al. |
| 2019/0393222 A1 | 12/2019 | Sharma et al. |
| 2020/0035683 A1 | 1/2020 | Sharma et al. |
| 2020/0083225 A1* | 3/2020 | Ma .................. H01L 23/528 |
| 2020/0098762 A1 | 3/2020 | Sharma et al. |
| 2020/0185392 A1 | 6/2020 | Makosiej et al. |
| 2020/0202900 A1 | 6/2020 | Kang et al. |
| 2020/0212041 A1 | 7/2020 | Machkaoutsan et al. |
| 2020/0227416 A1 | 7/2020 | Lilak et al. |
| 2020/0279601 A1 | 9/2020 | Kim et al. |
| 2021/0020781 A1 | 1/2021 | Cho et al. |
| 2021/0057417 A1 | 2/2021 | Cho et al. |
| 2021/0057419 A1 | 2/2021 | Shin et al. |
| 2021/0074706 A1 | 3/2021 | Dai |
| 2021/0082921 A1 | 3/2021 | Wada et al. |
| 2021/0151437 A1 | 5/2021 | Tomishima |
| 2021/0242208 A1 | 8/2021 | Manfrini et al. |
| 2021/0257369 A1 | 8/2021 | Hwang et al. |
| 2021/0280230 A1 | 9/2021 | Cho et al. |
| 2021/0296320 A1 | 9/2021 | Sandhu |
| 2021/0305230 A1 | 9/2021 | Okajima |
| 2021/0305431 A1 | 9/2021 | Ishimaru et al. |
| 2021/0343637 A1 | 11/2021 | Clampitt et al. |
| 2021/0343717 A1 | 11/2021 | Inaba |
| 2021/0358913 A1 | 11/2021 | Kim et al. |
| 2021/0375874 A1 | 12/2021 | Doornbos et al. |
| 2021/0375926 A1 | 12/2021 | Mehandru et al. |
| 2021/0391331 A1 | 12/2021 | Lin et al. |
| 2021/0408003 A1 | 12/2021 | Lin et al. |
| 2022/0068931 A1 | 3/2022 | Gomes et al. |
| 2022/0085212 A1 | 3/2022 | Sato et al. |
| 2022/0108987 A1 | 4/2022 | Lee et al. |
| 2022/0108988 A1 | 4/2022 | Kim et al. |

FOREIGN PATENT DOCUMENTS

| | | |
|---|---|---|
| WO | 2019022944 A1 | 1/2019 |
| WO | 2019046629 A1 | 3/2019 |
| WO | 2019168752 A1 | 9/2019 |
| WO | 2021218112 A1 | 11/2021 |
| WO | 2022057398 A1 | 3/2022 |

* cited by examiner

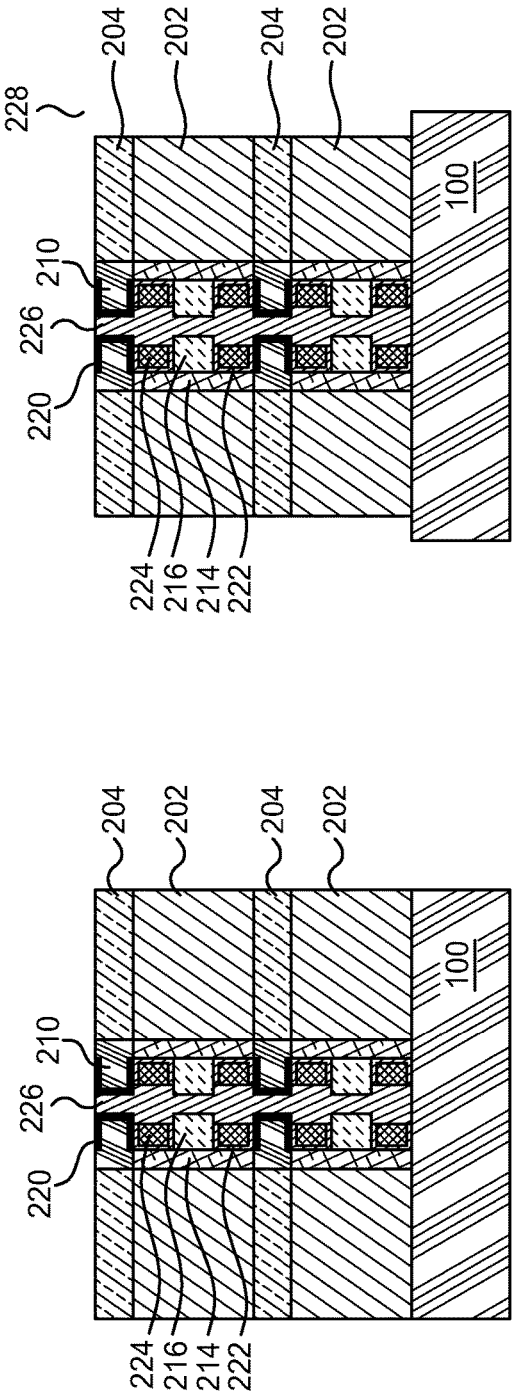
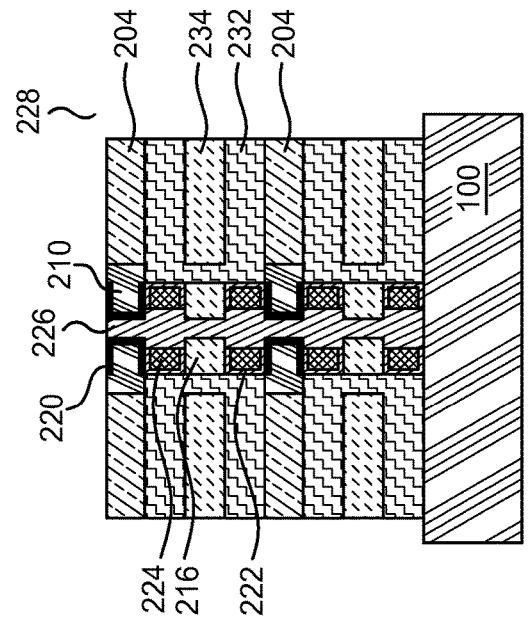
FIG. 21
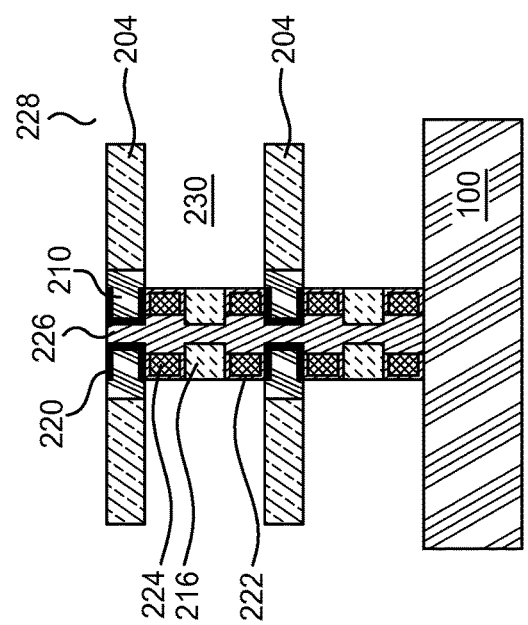
FIG. 23
FIG. 20
FIG. 22

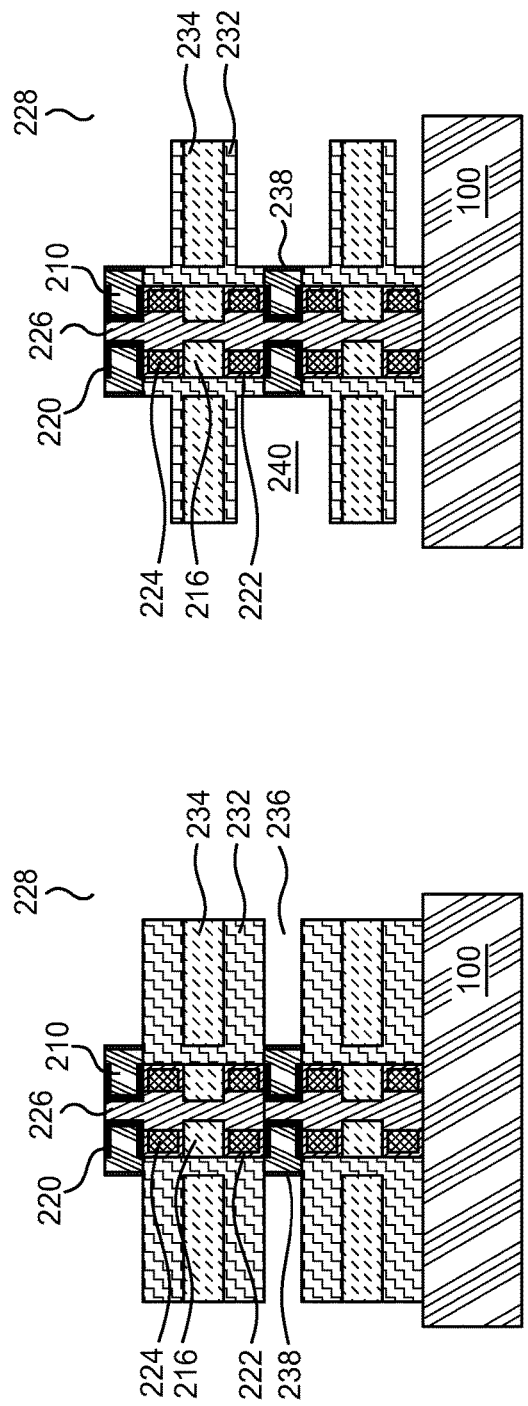
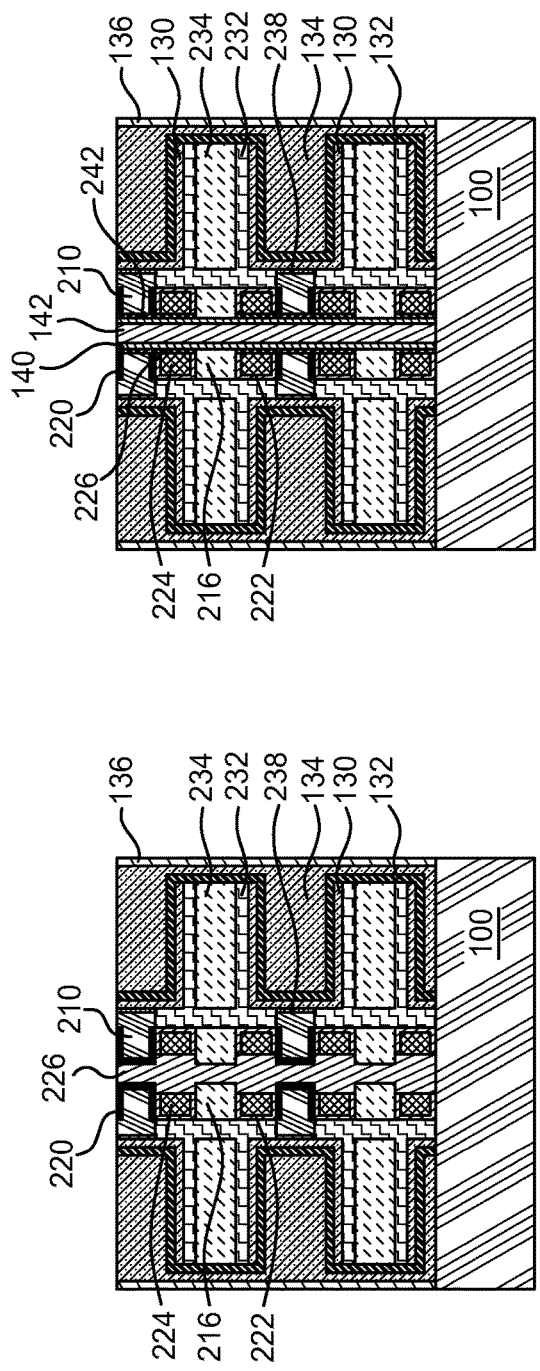
FIG. 24
FIG. 25
FIG. 26
FIG. 27

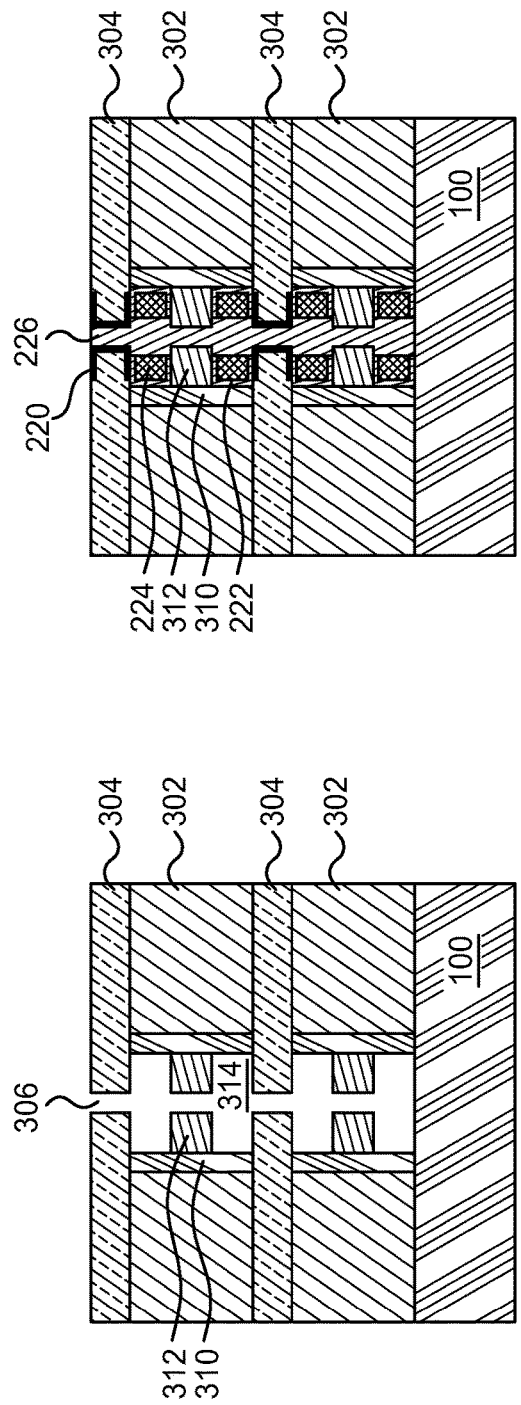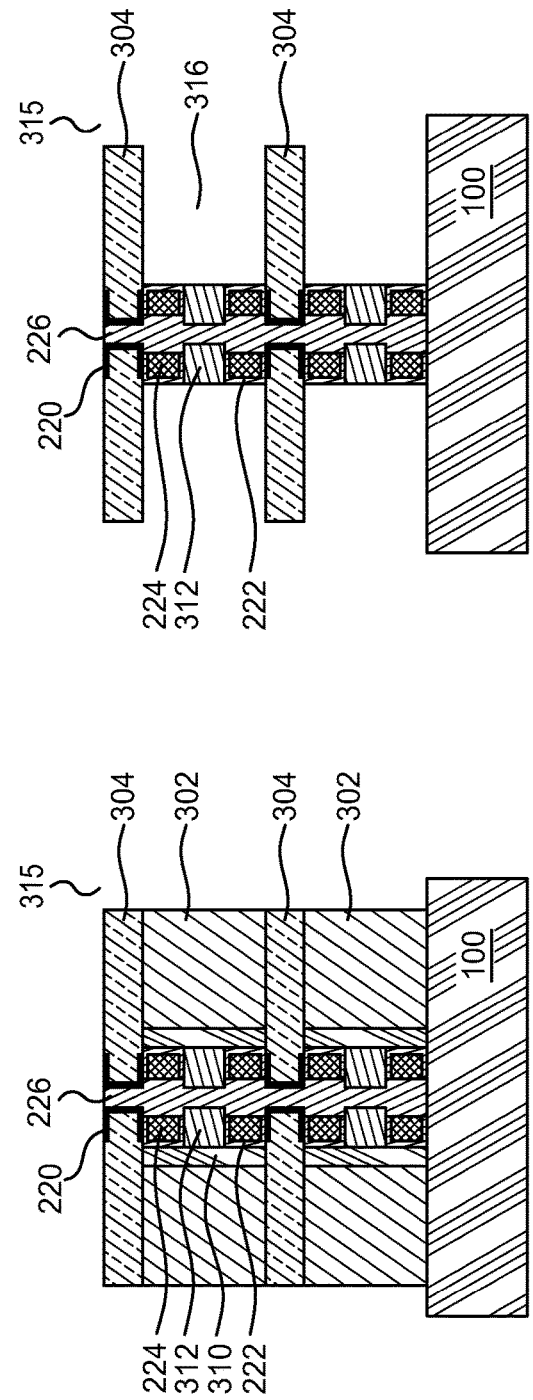

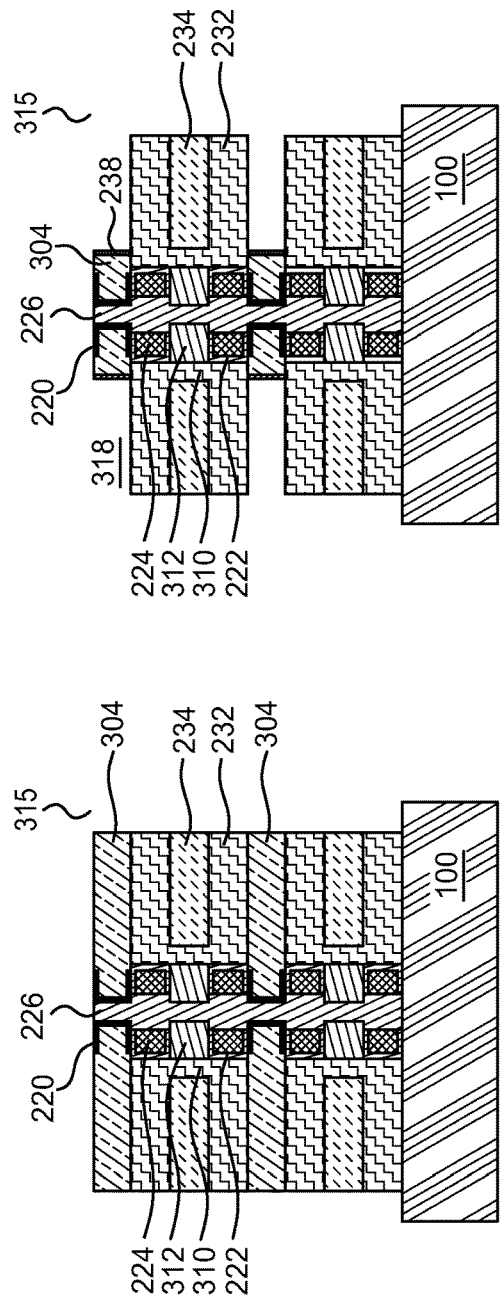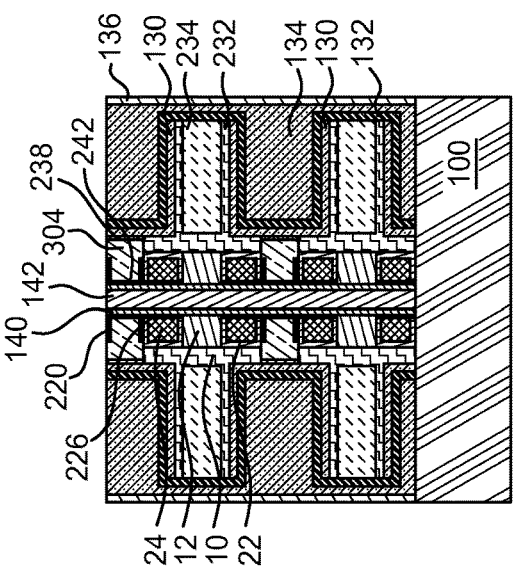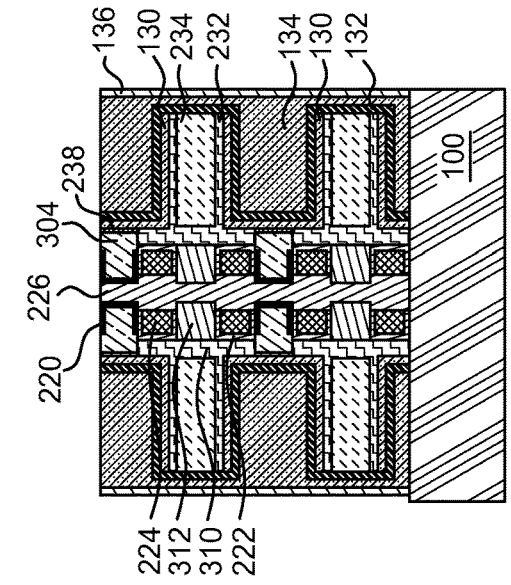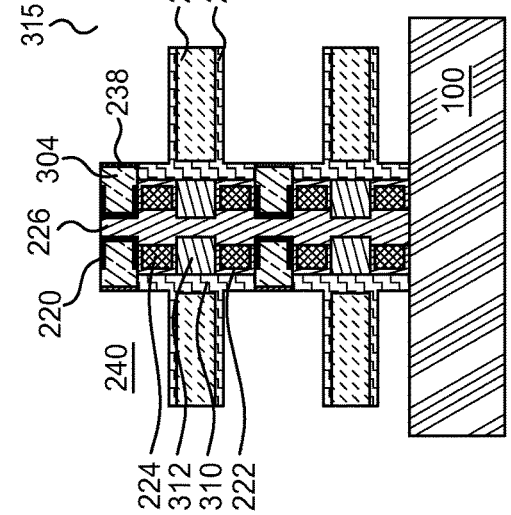

THREE-DIMENSIONAL DYNAMIC RANDOM ACCESS MEMORY (DRAM) AND METHODS OF FORMING THE SAME

CROSS-REFERENCE TO RELATED APPLICATIONS

This application claims priority to U.S. Provisional Patent Application Ser. No. 63/108,612, filed on Nov. 2, 2020, which is incorporated by reference herein.

BACKGROUND

Field

Examples described herein generally relate to the field of semiconductor processing, and more specifically, to three-dimensional (3D) dynamic random access memory (DRAM) and methods of forming 3D DRAM.

Description of the Related Art

Technology advances in semiconductor processing have resulted in integrated circuits reaching the physical limits of Moore's Law. These advances have resulted in new paradigms for devices and structures in integrated circuits. For example, various three-dimensional (3D) devices have been developed for integrated circuits. However, such 3D devices can result in a new set of challenges for processing and fabrication.

SUMMARY

Embodiments of the disclosure include a method for semiconductor processing. A film stack is formed on a substrate. The film stack includes multiple unit stacks, and each unit stack has a first dielectric layer, a semiconductor layer disposed on the first dielectric layer, and a second dielectric layer disposed on the semiconductor layer. A first opening is formed through the film stack. The second dielectric layer is pulled back from the first opening to form a first lateral recess. A gate structure is formed in the first lateral recess and disposed on a portion of the semiconductor layer. A second opening is formed through the film stack. The second opening is laterally disposed from where the first opening was formed. The gate structure is disposed laterally between the second opening and where the first opening was formed. The portion of the semiconductor layer is pulled back from the second opening to form a second lateral recess. A capacitor is formed in a region where the second lateral recess was disposed. The capacitor contacts the portion of the semiconductor layer.

Embodiments of the disclosure include a method for semiconductor processing. A film stack is formed on a substrate. The film stack includes multiple unit stacks, and each unit stack has a first layer and a second layer disposed on the first layer. A first opening is formed through the film stack. The first layer is pulled back from the first opening to form a first lateral recess. A first conformal layer is formed in the first lateral recess. A first fill material is formed on the first conformal layer and in the first lateral recess. The first conformal layer is pulled back from the first opening to form a second lateral recess. A gate structure is formed in the second lateral recess and disposed on and below a semiconductor layer. The semiconductor layer is horizontally aligned with the second layer. A second opening is formed through the film stack. The second opening is laterally disposed from where the first opening was formed. The gate structure is disposed laterally between the second opening and where the first opening was formed. The second layer is pulled back from the second opening to form a third lateral recess to the semiconductor layer. A capacitor is formed in a region where the third lateral recess was disposed. The capacitor contacts the semiconductor layer.

Embodiments of the disclosure include a method for semiconductor processing. A film stack is formed on a substrate. The film stack includes at least five layers. Each layer of the at least five layers is formed of a material selected from a group of materials including no more than three different materials. Vertically stacked mirrored DRAM pairs are formed on the substrate using the film stack as a mold. Each mirrored DRAM pair of the vertically stacked mirrored DRAM pairs includes a contact, a first transistor, a second transistor, a first capacitor, and a second capacitor. The first transistor includes a first gate structure, a first source/drain region, and a second source/drain region. The first source/drain region contacts the contact. The second transistor includes a second gate structure, a third source/drain region, and a fourth source/drain region. The third source/drain region contacts the contact. The second transistor mirrors the first transistor around the contact. The first capacitor has a first outer plate, a first capacitor dielectric layer, and a first inner plate. The first outer plate contacts the second source/drain region. The second capacitor has a second outer plate, a second capacitor dielectric layer, and a second inner plate. The second outer plate contacts the fourth source/drain region.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

FIGS. 13 through 27 are cross-sectional views of intermediate structures during a second method to form 3D DRAM cells according to some examples of the present disclosure.

FIGS. 28 through 40 are cross-sectional views of intermediate structures during a third method to form 3D DRAM cells according to some examples of the present disclosure.

To facilitate understanding, identical reference numerals have been used, wherever possible, to designate identical elements that are common to the figures.

DETAILED DESCRIPTION

Generally, examples described herein relate to semiconductor processing, and more specifically, to three-dimensional (3D) dynamic random access memory (DRAM) and methods of forming 3D DRAM. According to various examples, a film stack is formed on a substrate. The film stack includes, e.g., five or more layers, where each layer of those five or more layers is formed of a material that is selected from a group of no more than three different materials, and further, in some examples, from a group of no more than two different materials. The film stack is formed of one or multiple unit stacks, where each unit stack is formed of no more than two or three different materials. The film stack is used as a mold to form 3D DRAM devices. Specifically, the mold is used to form two or more vertically stacked mirrored DRAM pairs. In using mold processes, increases in the number of different materials used for layers of the mold can result in increased processing costs, including using additional deposition processes and etch processes. Reducing the number of different materials used for layers, such as by various examples described herein, can reduce the cost of processing, such has by having fewer deposition processes and etch processes, and therefore, can result in more cost-effective devices. Additionally, various numbers of vertically stacked mirrored DRAM pairs can be achieved without adding further different materials. Different examples herein can also achieve single or double gated transistors for 3D DRAM.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations. Additionally, although source and drain nodes and source and drain regions are described in various examples, such description can more generally be to a source/drain node or source/drain region. Further, in some examples, n-type transistors are described, and more generally, any type of transistor can be implemented.

Figure 1:
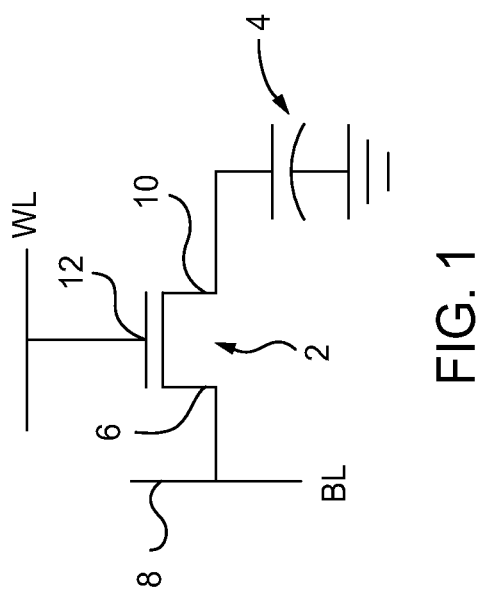
FIG. 1 is a circuit schematic of a dynamic random access memory (DRAM) cell according to some examples of the present disclosure.

FIG. 1 is a circuit schematic of a dynamic random access memory (DRAM) cell according to some examples of the present disclosure. The DRAM cell includes an n-type transistor 2 and a capacitor 4. A drain node 6 of the n-type transistor 2 is electrically connected to a bitline (BL) node 8. A source node 10 of the n-type transistor 2 is electrically connected to a first terminal of the capacitor 4, and a second terminal of the capacitor 4 (opposite from the first terminal) is electrically connected to a power supply node (e.g., a ground node). A gate node 12 of the n-type transistor 2 is electrically connected to a wordline (WL) node.

Figure 2:
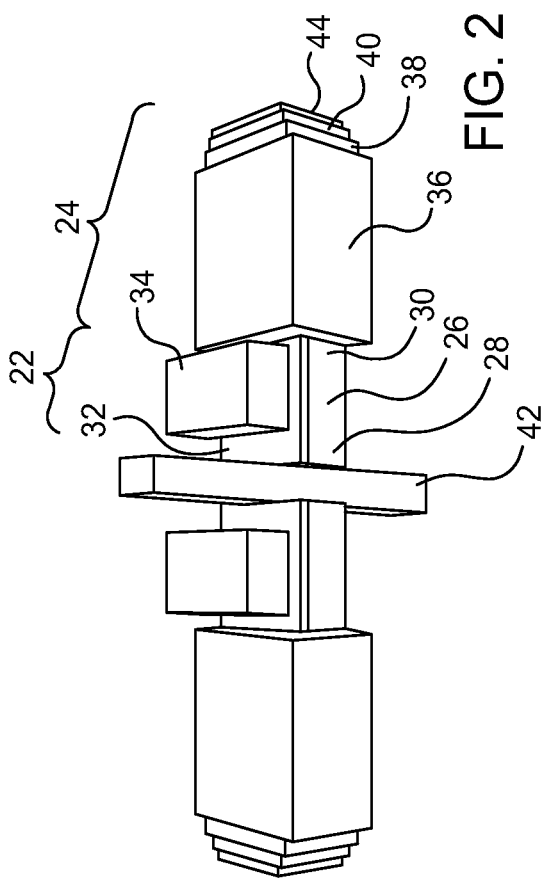
FIG. 2 is a perspective view of a mirrored DRAM pair according to some examples of the present disclosure.

FIG. 2 is a perspective view of a mirrored DRAM pair according to some examples of the present disclosure. FIG. 2 depicts two DRAM cells that are mirrored along a vertical axis, which may be referred to herein for convenience as a mirrored DRAM pair. As will become apparent in subsequent description, multiple mirrored DRAM pairs (e.g., two pairs, three pairs, etc.) may be stacked vertically in a DRAM structure. To avoid unnecessarily obscuring aspects of the figures, one DRAM cell of a mirrored DRAM pair is labeled with reference numbers, and a person having ordinary skill in the art will readily understand mirrored components in the other DRAM cell of the mirrored DRAM pair.

A DRAM cell includes an n-type transistor 22 and a capacitor 24. The n-type transistor 22 includes a semiconductor material 26 that forms the active region of the n-type transistor 22. The semiconductor material 26 may generally be p-doped, for example. A drain region 28 and a source region 30 are disposed in the semiconductor material 26 with a channel region between the drain region 28 and the source region 30 in the semiconductor material 26. The drain region 28 and the source region 30 are n-doped in this example. A gate dielectric layer 32 is disposed on the semiconductor material 26 (e.g., on a top surface of the semiconductor material 26), and a gate electrode 34 is disposed on the gate dielectric layer 32.

The capacitor 24 includes an outer plate 36, a capacitor dielectric layer 38, and an inner plate 40. The outer plate 36 is a conductive material, such as a metal or metal-containing material. The outer plate 36 generally has the shape of a single-capped cylinder, single-capped rectangular prism, or the like. The outer plate 36 generally extends laterally from the n-type transistor 22 and has a capped end that contacts the source region 30 of the n-type transistor 22 to electrically connect the source region 30 to the capacitor 24. The end of the outer plate 36 opposite from the n-type transistor 22 is open. The capacitor dielectric layer 38 is a dielectric material that is disposed conformally along interior surfaces of the outer plate 36. The dielectric material of the capacitor dielectric layer 38 can be a high-k dielectric material (e.g., having a k-value greater than 4.0). The inner plate 40 is a conductive material, such as a metal or metal-containing material, and is disposed on the capacitor dielectric layer 38 and fills a remaining interior portion of the outer plate 36.

A bitline contact 42 is disposed laterally contacting the drain region 28 of the n-type transistor 22. The bitline contact 42 extends vertically, and the vertical axis along which the mirror DRAM pair is mirrored extends along the bitline contact 42. A power supply contact 44 (e.g., a ground contact) is disposed laterally contacting the inner plate 40 of the capacitor 24.

Figure 3:
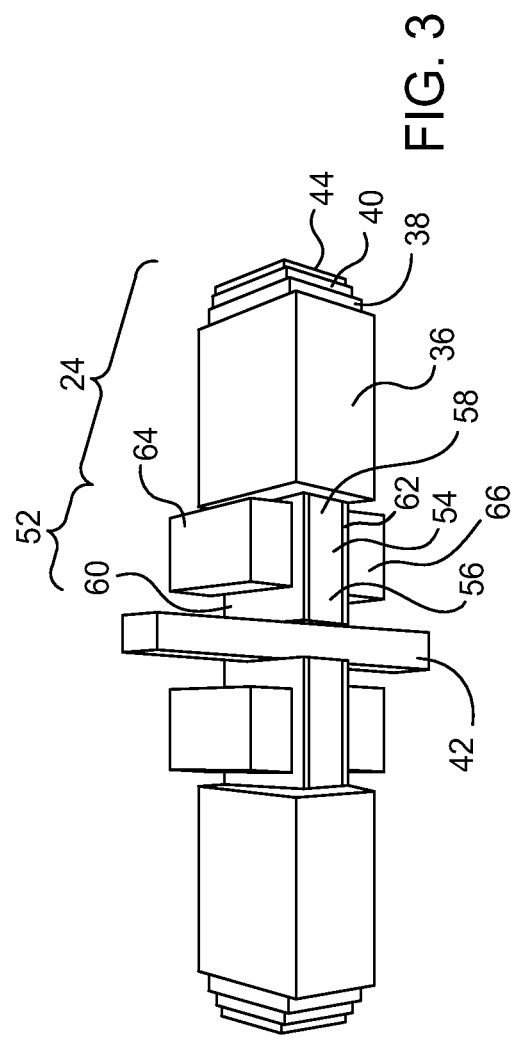
FIG. 3 is a perspective view of a mirrored DRAM pair according to some examples of the present disclosure.

FIG. 3 is a perspective view of a mirrored DRAM pair according to some examples of the present disclosure. The 3D DRAM cells of FIG. 3 are like the 3D DRAM cells of FIG. 2, and common description is omitted for brevity. A DRAM cell includes an n-type transistor 52 and a capacitor 24. The n-type transistor 52 includes a semiconductor material 54 that forms the active region of the n-type transistor 52. The semiconductor material 54 may generally be p-doped, for example. A drain region 56 and a source region 58 are disposed in the semiconductor material 54 with a channel region between the drain region 56 and the source region 58 in the semiconductor material 54. The drain region 56 and the source region 58 are n-doped in this example. A top gate dielectric layer 60 is disposed on the semiconductor material 54 (e.g., on a top surface of the semiconductor material 54), and a bottom gate dielectric layer 62 is disposed on the semiconductor material 54 on a side opposite from the top gate dielectric layer 60 (e.g., on a bottom surface of the semiconductor material 54). A top gate electrode 64 is disposed on (e.g., over) the top gate dielectric layer 60, and a bottom gate electrode 66 is disposed on (e.g., below) the bottom gate dielectric layer 62.

The capped end of the outer plate 36 contacts the source region 58 of the n-type transistor 52 to electrically connect the source region 58 to the capacitor 24. The bitline contact 42 is disposed laterally contacting the drain region 56 of the n-type transistor 52.

FIGS. 4 through 12 are cross-sectional views of intermediate structures during a first method to form 3D DRAM cells according to some examples of the present disclosure. The 3D DRAM cells formed according to the first method of FIGS. 4 through 12 can be like shown in FIG. 2.

Figure 4:
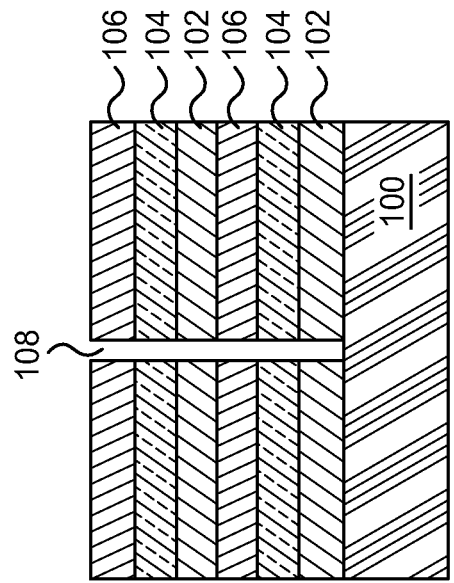
FIGS. 4 through 12 are cross-sectional views of intermediate structures during a first method to form 3D DRAM cells according to some examples of the present disclosure.

Referring to FIG. 4, a film stack is deposited on a substrate 100. The film stack includes multiple unit stacks (e.g., two unit stacks in the illustrated example) that are, in part, used sacrificially to form 3D DRAM cells. As will become apparent, this method forms two layers of 3D DRAM cells. In other examples, repeating the unit stacks of the film stack can enable forming additional layers of 3D DRAM cells. Also, using one instance of the unit stack in the film stack can enable forming one layer of 3D DRAM cells.

The substrate 100 includes any appropriate semiconductor substrate, such as a bulk substrate, semiconductor-on-insulator (SOI) substrate, or the like. In some examples, the semiconductor substrate is a bulk silicon wafer. Examples of substrate sizes include 200 mm diameter, 350 mm diameter, 400 mm diameter, and 450 mm diameter, among others. The substrate 100 can further include any layer (e.g., any number of other dielectric layers) or structure on the semiconductor substrate.

The film stack includes multiple unit stacks, where a unit stack includes a first dielectric layer 102, a semiconductor layer 104, and a second dielectric layer 106. The unit stack of the film stack is or consists of a first dielectric layer 102, a semiconductor layer 104 on the first dielectric layer 102, and a second dielectric layer 106 on the semiconductor layer 104. Two instances of this unit stack are stacked on the substrate 100 in FIG. 4. The first dielectric layers 102 can each be a same dielectric material, and the second dielectric layers 106 can each be a same dielectric material that is different from and has etch selectivity between the dielectric material of the first dielectric layers 102. The semiconductor layers 104 can each be a same semiconductor material. Generally, the materials of the different layers permit selectively etching targeted layers during processing, as will become apparent. The film stack is used as a mold for forming the DRAM cells. In some examples, the first dielectric layers 102 are silicon oxide; the second dielectric layers 106 are silicon nitride; and the semiconductor layers 104 are silicon (e.g., amorphous or polycrystalline, which may be p-doped) or InGaZnO. Each layer of the first dielectric layers 102, semiconductor layers 104, and second dielectric layers 106 can be deposited by any appropriate deposition technique, such as chemical vapor deposition (CVD), physical vapor deposition (PVD), or the like.

Figure 5:
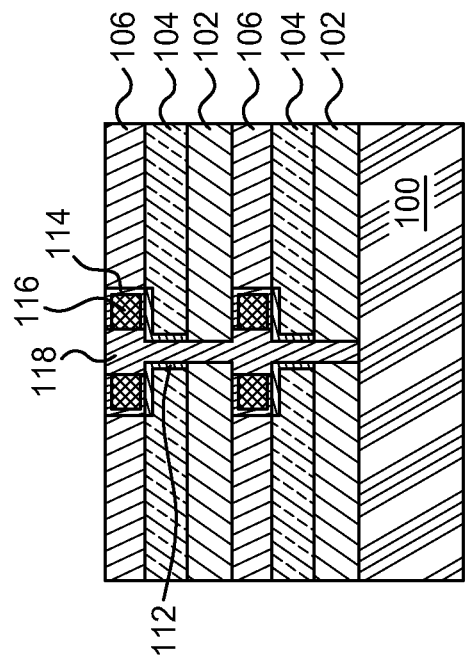

In FIG. 5, an opening 108 is formed through the film stack (e.g., through the first dielectric layers 102, semiconductor layers 104, and second dielectric layers 106). The opening 108 can be formed using an anisotropic etch, such as a reactive ion etch (RIE) or the like.

Figure 6:
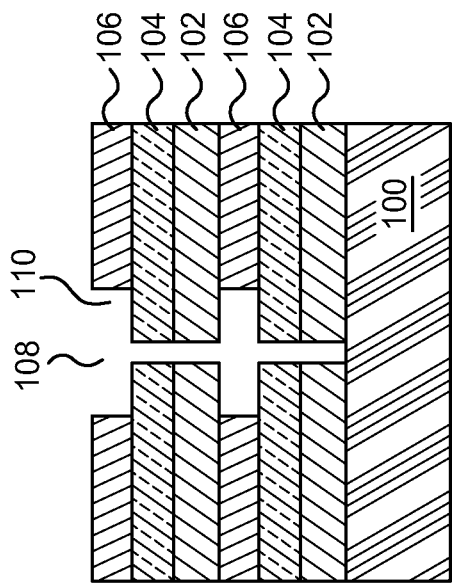

In FIG. 6, the second dielectric layers 106 are pulled back from the opening 108 to form lateral recesses 110 from the opening 108. The pull back process can be any appropriate isotropic etch that selectively etches the second dielectric layers 106. For example, when the second dielectric layers 106 are silicon nitride, a hot phosphoric acid etch process can be used to pull back the second dielectric layers 106. The multiple layers in the film stack (e.g., the first dielectric layers 102 and semiconductor layers 104) can reduce a likelihood of an occurrence of collapse when pulling back the second dielectric layers 106.

Figure 7:
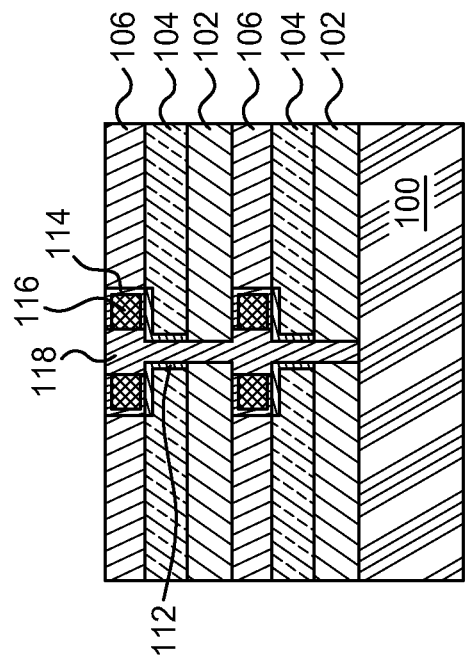

FIG. 7 illustrates gate dielectric layers 112, gate barrier and/or work-function tuning ("barrier/tuning") layers 114, gate electrode fill material 116, and dielectric fill material 118. The gate dielectric layers 112 are formed on surfaces of respective semiconductor layers 104 that are exposed by the opening 108 and lateral recesses 110. The gate dielectric layers 112 can be any appropriate dielectric material formed by any appropriate process. In some examples, the gate dielectric layers 112 are an oxide formed by an oxidation process (e.g., by oxidizing exposed surfaces of the semiconductor layers 104). In some examples, the gate dielectric layers 112 can be another material formed by a conformal deposition process, such as atomic layer deposition (ALD).

The gate barrier/tuning layers 114 are then conformally formed along surfaces of the lateral recesses 110, and the gate electrode fill material 116 is formed on the gate barrier/tuning layers 114. In some examples, the gate barrier/tuning layers 114 are formed using a conformal deposition process, such as ALD. The conformal deposition process can form a conformal layer on surfaces that define the opening 108 and lateral recesses 110 (e.g., including the gate dielectric layers 112). A conductive material of the gate electrode fill material 116 can then be deposited, by any appropriate deposition process, on the conformal layer. A node separation process is performed to remove some of the conductive material of the gate electrode fill material 116 and some of the conformal layer of the gate barrier/tuning layers 114 to form the gate barrier/tuning layers 114 and the gate electrode fill material 116 in respective lateral recesses 110. The node separation process can include performing an anisotropic etch, such as an RIE, followed by an isotropic etch selective to the materials of the gate barrier/tuning layers 114 and the gate electrode fill material 116. The anisotropic etch may remove the conductive material of the gate electrode fill material 116 and the conformal layer of the gate barrier/tuning layers 114 between vertical sidewall surfaces of the first dielectric layers 102 and the second dielectric layers 106 that define the opening 108. The isotropic etch laterally recesses the gate electrode fill material 116 and the gate barrier/tuning layers 114 to have vertical sidewalls that are offset from the vertical sidewall surfaces of the first dielectric layers 102 and the semiconductor layers 104 that define the opening 108. In some examples, the gate barrier/tuning layers 114 can be any appropriate diffusion barrier material and/or can be any work-function tuning material to tune the threshold voltage of a transistor, such as TiN or the like. In some examples, the gate electrode fill material 116 can be any conductive material, such as a metal, like tungsten.

The dielectric fill material 118 is then formed in the remaining unfilled portions of the lateral recesses 110 and the opening 108. The dielectric fill material 118 can be any appropriate dielectric material deposited by any appropriate deposition process. In some examples, the dielectric fill material 118 is an oxide deposited by a conformal deposition, such as ALD, or a flowable deposition process, such as flowable CVD (FCVD).

Figure 8:
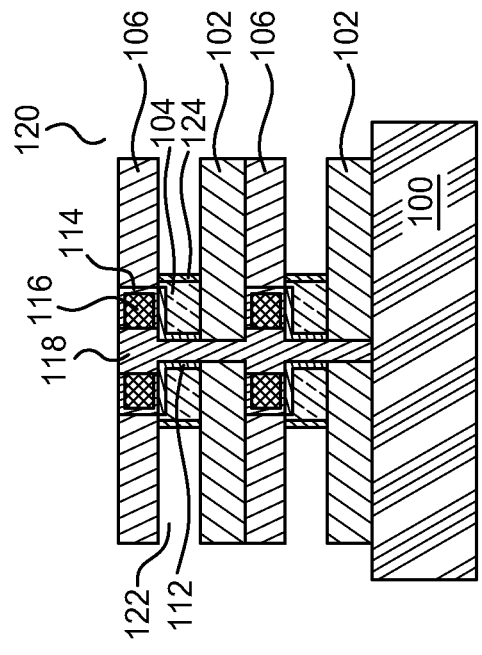

In FIG. 8, openings 120 are formed through the film stack (e.g., through the first dielectric layers 102, semiconductor layers 104, and second dielectric layers 106). As will become apparent, each opening 120 is used in the formation of capacitors that will be electrically connected to respective transistors, of which the gate electrode fill material 116 and gate barrier/tuning layers 114 are a part. Each opening 120 is disposed some lateral distance from the corresponding gate electrode fill material 116 and gate barrier/tuning layers 114, with the corresponding gate electrode fill material 116 and gate barrier/tuning layer 114 disposed laterally between the respective opening 120 and where the opening 108 was formed (e.g., which is filed by the dielectric fill material 118). The openings 120 can be formed using an anisotropic etch, such as a reactive ion etch (RIE) or the like.

Figure 9:
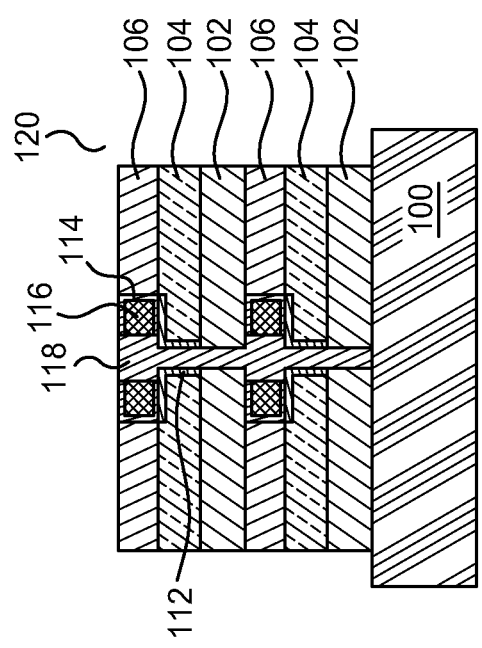

In FIG. 9, the semiconductor layers 104 are pulled back from the respective openings 120 to form lateral recesses 122 from the respective openings 120. The pull back process can be any appropriate isotropic etch that selectively etches the semiconductor layers 104. For example, when the semiconductor layers 104 are silicon, a tetramethylammonium hydroxide (TMAH) etch process or dry plasma isotropic etch can be used to pull back the semiconductor layers 104.

The semiconductor layers 104 are doped at vertical sidewall surfaces of the semiconductor layers 104 at the respective lateral recesses 122 to form source regions 124. The source regions 124 can be doped with n-type dopants. The doping can be performed using a gas-phase dopant and/or a plasma assisted doping process.

Figure 10:
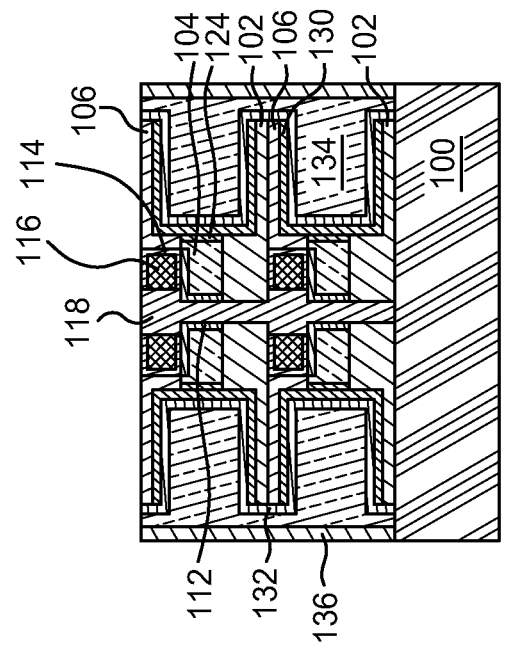

In FIG. 10, the lateral recesses 122 are expanded to form enlarged lateral recesses 126. The expansion can include an isotropic etch that selectively etches the second dielectric layers 106 and an isotropic etch that selectively etches the first dielectric layers 102. The isotropic etch can be a wet or dry process. In some examples where the first dielectric layers 102 are silicon oxide and the second dielectric layers 106 are silicon nitride, a hot phosphoric acid etch process or a dry plasma etch process can be used to etch the second dielectric layers 106, and a hydrofluoric acid based process (e.g., a wet diluted hydrofluoric acid (dHF) or a dry HF process) can be used to etch the first dielectric layers 102.

Figure 11:
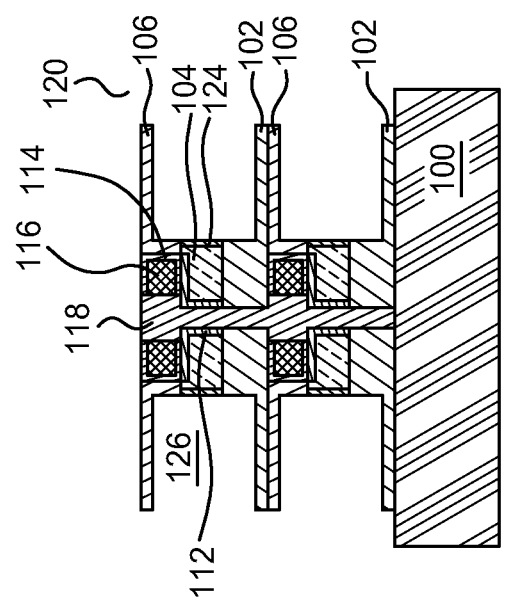

FIG. 11 shows the formation of capacitors in the enlarged lateral recesses 126. Each capacitor includes an outer plate 130, a capacitor dielectric layer 132, and an inner plate 134. The outer plates 130 are conformally formed along surfaces of the enlarged lateral recesses 126. In some examples, the outer plates 130 are formed using a conformal deposition process, such as ALD. The conformal deposition process can form a conformal layer on surfaces that define the openings 120 and enlarged lateral recesses 126 (e.g., including a respective sidewall surface of the semiconductor layer 104 where the corresponding source region 124 is disposed). A node separation process is performed to remove some of the conformal layer on vertical sidewalls that define the openings 120 to form the outer plates 130 in respective enlarged lateral recesses 126. The node separation process can include filling the openings 120 and enlarged lateral recesses 126 with a fill material, and performing appropriate anisotropic and isotropic etch processes to remove portions of the conformal layer from the vertical sidewalls that define the openings 120 (e.g., vertical sidewalls of the first dielectric layers 102 and second dielectric layers 106) and to remove the fill material.

The capacitor dielectric layers 132 are then formed on the inner surfaces of the respective outer plates 130. The capacitor dielectric layers 132 can be formed by a conformal deposition, such as ALD, that forms a conformal capacitor dielectric layer 132 in a respective opening 120 (e.g., along vertical sidewalls of the first dielectric layers 102 and second dielectric layers 106 that define the opening 120) and the inner surfaces of the respective outer plate 130.

The inner plates 134 are then formed on the outer plates 130. The inner plates 134 can be formed by a conformal deposition, such as ALD, that forms the inner plates 134 on the capacitor dielectric layers 132. In the illustrated example, the inner plates 134 fill the remaining unfilled portion of the enlarged lateral recesses 126, although in some examples, the inner plates 134 may not fill the remaining unfiled portion of the enlarged lateral recesses 126. As illustrated, the inner plates 134 can be formed by a continuous material deposited in the respective opening 120 and enlarged lateral recesses 126. Since the inner plates 134 form the terminals of the respective DRAM cells that are electrically connected to a power supply node (e.g., a ground node), as described with respect to FIG. 1, the inner plates 134 can be electrically connected together by the continuous material that forms the inner plates 134. In the illustrated example, the material of the inner plates 134 does not fill the openings 120, and a conductive fill material 136 is formed in the unfilled portion of the openings 120. In some examples, the material of the inner plates 134 fills the remaining unfilled portion of the openings 120. The inner plates 134 being electrically connected together, e.g., by the material of the inner plates 134 and/or the conductive fill material 136 forms a power supply node (e.g., a ground node) connected between multiple DRAM cells. In examples where the conductive fill material 136 is used, the conductive fill material 136 can be deposited by any appropriate deposition process, such as CVD, PVD, or the like.

In some examples, the material of the outer plates 130 and the material of the inner plates 134 can be any conductive material, such as a metal or metal-containing material, such as TiN. In some examples, the material of the capacitor dielectric layer 132 can be any dielectric material, and further, can be any high-k dielectric material (e.g., having a k-value of greater than 4.0). In some examples, the conductive fill material 136 can be any conductive material, such as silicon germanium (e.g., doped silicon germanium).

Figure 12:
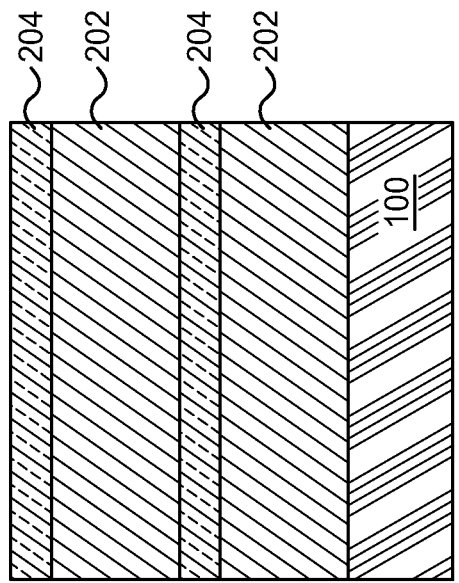

In FIG. 12, a drain region 138, a barrier layer 140, and a conductive fill material 142 are formed. An opening is formed through the dielectric fill material 118. The opening exposes vertical sidewalls of the semiconductor layers 104. An etch process can be used to form the opening and expose the vertical sidewalls of the semiconductor layers 104. For example, the etch process can include an anisotropic etch and/or an isotropic etch. The gate dielectric layers 112 that were previously formed on the vertical sidewalls of the semiconductor layers 104 are removed by the etch process to expose the vertical sidewalls of the semiconductor layers 104.

Lateral portions of the semiconductor layers 104 at respective vertical sidewalls exposed by the opening are doped to form drain regions 138. The drain regions 138 can be doped with n-type dopants. The doping can be performed using a gas-phase dopant and/or a plasma assisted doping process. With the drain regions 138 formed, a respective transistor is formed for the DRAM cells. For each DRAM cell, the transistor includes the source region 124 in the semiconductor layer 104, the drain region 138 in the semiconductor layer 104, a channel region in the semiconductor layer 104 between the source region 124 and the drain region 138, and a gate structure disposed on the semiconductor layer 104 aligned over the channel region. The gate structure includes the gate dielectric layer 112 and the gate electrode fill material 116. This method can permit very thin portions of the semiconductor layers 104 to be implemented for the channel regions of the transistors.

The barrier layer 140 is then formed in the opening. The barrier layer 140 is conformally formed along surfaces of the opening, including along the exposed vertical sidewalls of the semiconductor layers 104 where the drain regions 138 are disposed. In some examples, the barrier layer 140 is formed using a conformal deposition process, such as ALD. The conductive fill material 142 can then be deposited, by any appropriate deposition process, on the barrier layer 140. In some examples, the barrier layer 140 can be any appropriate diffusion barrier material, such as TiN or the like. In some examples, the conductive fill material 142 can be any conductive material, such as a metal, like tungsten. The barrier layer 140 and the conductive fill material 142 generally form a contact, which may be a bitline node of the DRAM cells. This contact is along a vertical axis around which mirrored DRAM pairs are mirrored.

FIGS. 13 through 27 are cross-sectional views of intermediate structures during a second method to form 3D DRAM cells according to some examples of the present disclosure. The 3D DRAM cells formed according to the second method of FIGS. 13 through 27 can be like shown in FIG. 3.

Figure 13:
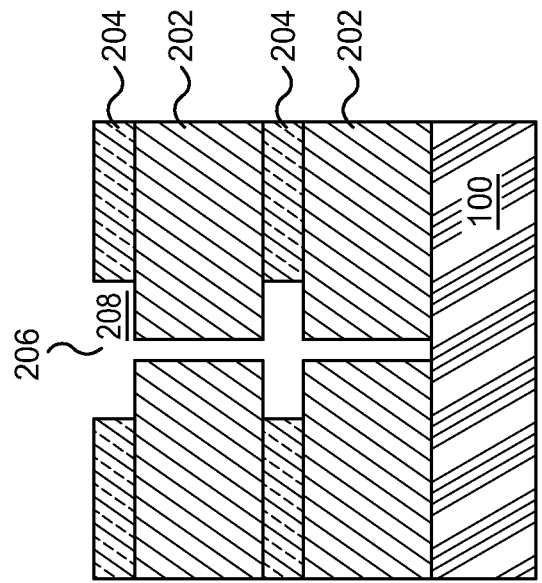

Referring to FIG. 13, a film stack is deposited on a substrate 100. The film stack includes a multiple unit stacks (e.g., two unit stacks in the illustrated example) that are, in part, used sacrificially to form 3D DRAM cells. As will become apparent, this method forms two layers of 3D DRAM cells. In other examples, repeating the unit stacks of the film stack can enable forming additional layers of 3D DRAM cells. Also, using one instance of the unit stack in the film stack can enable forming one layer of 3D DRAM cells.

The film stack includes multiple unit stacks, where a unit stack includes a sacrificial layer 202 and dielectric layer 204. The unit stack of the film stack is or consists of a sacrificial layer 202 and a dielectric layer 204 on the sacrificial layer 202. Two instances of this unit stack are stacked on the substrate 100 in FIG. 13. The sacrificial layers 202 can each be a same material, and the dielectric layers 204 can each be a same dielectric material that is different from and has etch selectivity between the material of the sacrificial layers 202. Generally, the materials of the different layers permit selectively etching targeted layers during processing, as will become apparent. The film stack is used as a mold for forming the DRAM cells. In some examples, the sacrificial layers 202 are silicon, silicon germanium, doped silicon oxide, borophosphosilicate glass (BPSG), phosphosilicate glass (PSG), or silicon nitride, and the dielectric layers 204 are silicon oxide. Each layer of the sacrificial layers 202 and dielectric layers 204 can be deposited by any appropriate deposition technique, such as CVD, PVD, or the like.

Figure 14:
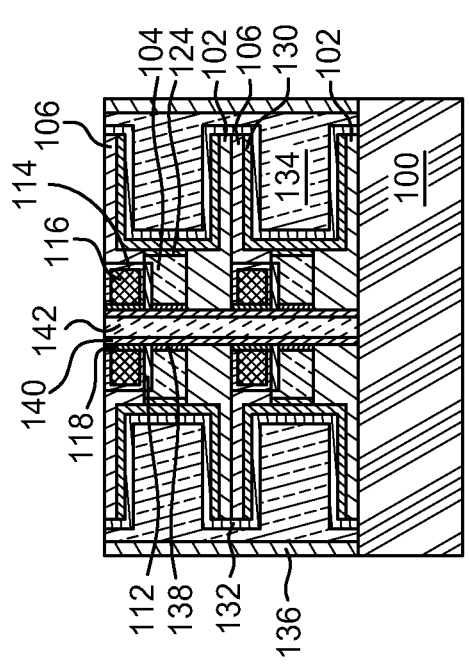

In FIG. 14, an opening 206 is formed through the film stack (e.g., through the sacrificial layers 202 and dielectric layers 204). The opening 206 can be formed using an anisotropic etch, such as a RIE or the like.

Figure 15:
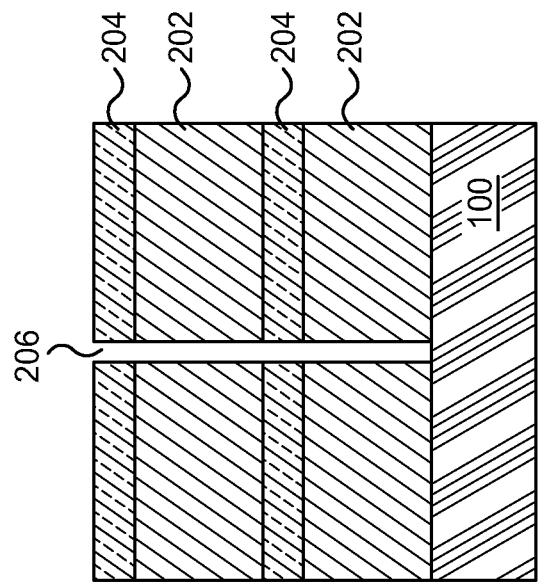

In FIG. 15, the dielectric layers 204 are pulled back from the opening 206 to form lateral recesses 208 from the opening 206. The pull back process can be any appropriate isotropic etch that selectively etches the dielectric layers 204. For example, when the dielectric layers 204 are silicon oxide, a hydrofluoric acid based process (e.g., a wet dHF or a dry HF process) can be used to etch the dielectric layers 204.

Figure 16:
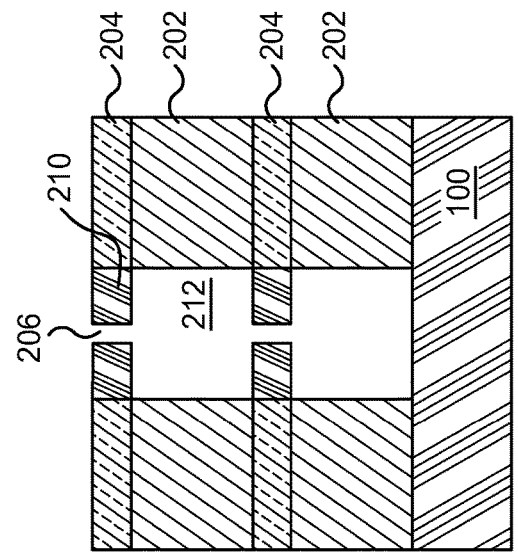

In FIG. 16, semiconductor layers 210 are formed filling the lateral recesses 208. The semiconductor layers 210 can be formed using a conformal deposition, such as ALD, that conformally deposits the material of the semiconductor layers 210 along surfaces that define the opening 206 and lateral recesses 208. An anisotropic etch can be used to remove the material of the semiconductor layers 210 from between sidewalls of the sacrificial layers 202 that define the opening 206. The semiconductor layers 210 can be any semiconductor material. In some examples, the semiconductor layers 210 are silicon (e.g., amorphous or polycrystalline, which may be p-doped) or InGaZnO.

Figure 17:
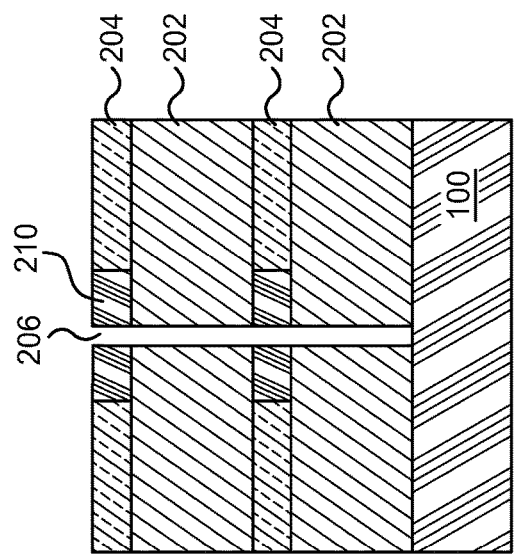

In FIG. 17, the sacrificial layers 202 are pulled back from the opening 206 to form lateral recesses 212 from the opening 206. In some examples, the sacrificial layers 202 are pulled back to or beyond corresponding vertical sidewalls of the semiconductor layers 210 that are distal from the opening 206. The pull back process can be any appropriate isotropic etch that selectively etches the sacrificial layers 202. For example, when the sacrificial layers 202 are silicon nitride, a hot phosphoric acid etch process can be used to pull back the sacrificial layers 202.

Figure 18:
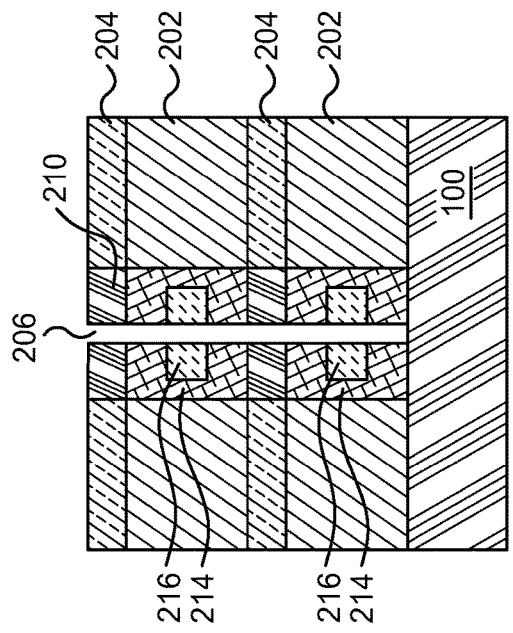

FIG. 18 illustrates a conformal sacrificial material 214 and a dielectric fill material 216. The conformal sacrificial material 214 can be formed using a conformal deposition, such as ALD, that conformally deposits the material of the conformal sacrificial material 214 along surfaces that define the opening 206 and lateral recesses 212 (e.g., vertical sidewalls of the sacrificial layers 202 and exposed surfaces of the semiconductor layers 210). The dielectric fill material 216 can be deposited on the conformally deposited material of the conformal sacrificial material 214 by any appropriate deposition, such as by ALD, FCV, or the like, to fill the remaining unfilled portions of the opening 206 and lateral recesses 212. An anisotropic etch can be used to remove the material of the conformal sacrificial material 214 and the dielectric fill material 216 from between sidewalls of, e.g., the semiconductor layers 210 that define the opening 206. The conformal sacrificial material 214 can be any sacrificial material, such as a sacrificial dielectric material, and the dielectric fill material 216 can be any dielectric material. In some examples, the conformal sacrificial material 214 is silicon nitride, and the dielectric fill material 216 is silicon oxide.

Figure 19:
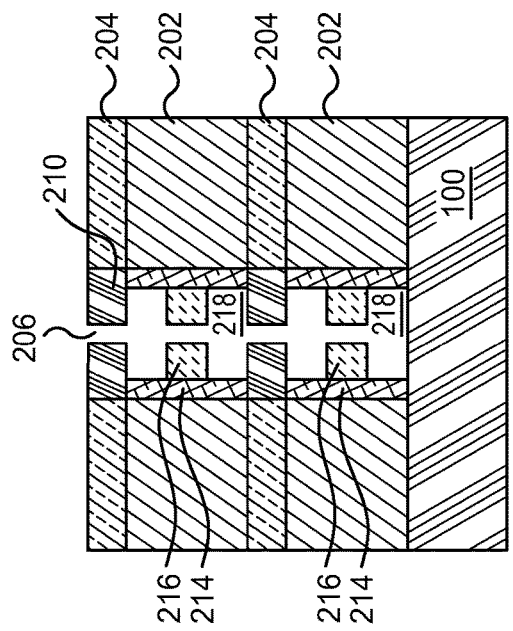

In FIG. 19, lateral portions of the conformal sacrificial material 214 are pulled back from the opening 206 to form lateral recesses 218 from the opening 206. The dielectric fill material 216 formed on a respective conformal sacrificial material 214 can remain disposed vertically between the lateral recesses 218 formed by pulling back the respective conformal sacrificial material 214. The pull back process can be any appropriate isotropic etch that selectively etches the conformal sacrificial material 214. For example, when the conformal sacrificial material 214 is silicon nitride, a hot phosphoric acid etch process can be used to pull back the conformal sacrificial material 214.

FIG. 20 illustrates gate dielectric layers 220, gate barrier/tuning layers 222, gate electrode fill material 224, and dielectric fill material 226. The gate dielectric layers 220 are formed on surfaces of respective semiconductor layers 210 that are exposed by the opening 206 and lateral recesses 218. The gate dielectric layers 220 can be any appropriate dielectric material formed by any appropriate process. In some examples, the gate dielectric layers 220 are an oxide formed by an oxidation process (e.g., by oxidizing exposed surfaces of the semiconductor layers 210). In some examples, the gate dielectric layers 220 can be another material formed by a conformal deposition process, such as ALD.

The gate barrier/tuning layers 222 are then conformally formed along surfaces of the lateral recesses 218, and the gate electrode fill material 224 is formed on the gate barrier/tuning layers 222. In some examples, the gate barrier/tuning layers 222 are formed using a conformal deposition process, such as ALD. The conformal deposition process can form a conformal layer on surfaces that define the opening 206 and lateral recesses 218 (e.g., including the gate dielectric layers 220). A conductive material of the gate electrode fill material 224 can then be deposited, by any appropriate deposition process, on the conformal layer. A node separation process is performed to remove some of the conductive material of the gate electrode fill material 224 and some of the conformal layer of the gate barrier/tuning layers 222 to form the gate barrier/tuning layers 222 and the gate electrode fill material 224 in respective lateral recesses 218. The node separation process can include performing an anisotropic etch, such as an RIE, followed by an isotropic etch selective to the materials of the gate barrier/tuning layers 222 and the gate electrode fill material 224. The anisotropic etch may remove the conductive material of the gate electrode fill material 224 and the conformal layer of the gate barrier/tuning layers 222 between vertical sidewall surfaces of, e.g., the dielectric fill material 216 and the semiconductor layers 210 that define the opening 206. The isotropic etch laterally recesses the gate electrode fill material 224 and the gate barrier/tuning layers 222 to have vertical sidewalls that are offset from the vertical sidewall surfaces of the dielectric fill material 216 and the semiconductor layers 210 that define the opening 206. In some examples, the gate barrier/tuning layers 222 can be any appropriate diffusion barrier material and/or can be any work-function tuning material to tune the threshold voltage of a transistor, such as TiN or the like. In some examples, the gate electrode fill material 224 can be any conductive material, such as a metal, like tungsten.

The dielectric fill material 226 is then formed in the remaining unfilled portions of the lateral recesses 208 and the opening 206. The dielectric fill material 226 can be any appropriate dielectric material deposited by any appropriate deposition process. In some examples, the dielectric fill material 226 is an oxide deposited by a conformal deposition, such as ALD, or a flowable deposition process, such as FCVD.

In FIG. 21, openings 228 are formed through the film stack (e.g., through the sacrificial layers 202 and dielectric layers 204). As will become apparent, each opening 228 is used in the formation of capacitors that will be electrically connected to respective transistors, of which the gate electrode fill material 224 and gate barrier/tuning layers 222 are a part. Each opening 228 is disposed some lateral distance from the corresponding gate electrode fill material 224 and gate barrier/tuning layers 222, with the corresponding gate electrode fill material 224 and gate barrier/tuning layers 222 disposed laterally between the respective opening 228 and where the opening 206 was formed (e.g., which is filled by the dielectric fill material 226). The openings 228 can be formed using an anisotropic etch, such as a RIE or the like.

In FIG. 22, the sacrificial layers 202 are pulled back from the respective openings 228 to form lateral recesses 230 from the respective openings 228. In some examples, the sacrificial layers 202 are removed by the pull back process. In some examples, such as illustrated, the pull back process can also remove the conformal sacrificial material 214, such as when the sacrificial layers 202 and conformal sacrificial material 214 are a same material The pull back process can be any appropriate isotropic etch that selectively etches the sacrificial layers 202. For example, when the sacrificial layers 202 are silicon nitride, a hot phosphoric acid etch process can be used to pull back the sacrificial layers 202, and possibly, also the conformal sacrificial material 214.

FIG. 23 illustrates a conformal dielectric material 232 and a dielectric fill material 234. The conformal dielectric material 232 can be formed using a conformal deposition, such as ALD, that conformally deposits the material of the conformal dielectric material 232 along surfaces that define the opening 228 and lateral recesses 230 (e.g., exposed surfaces of the dielectric layers 204, dielectric fill material 216, and the gate barrier/tuning layer 222). The dielectric fill material 234 can be deposited on the conformally deposited material of the conformal dielectric material 232 by any appropriate deposition, such as by ALD, FCV, or the like, to fill the remaining unfilled portions of the opening 228 and lateral recesses 230. An anisotropic etch can be used to remove the material of the conformal dielectric material 232 and the dielectric fill material 234 from between sidewalls of, e.g., the dielectric layers 204 that define the openings 228. The conformal dielectric material 232 and the dielectric fill material 234 can be any dielectric material that can be selectively etched relative to each other (e.g., the material of the conformal dielectric material 232 is different from the material of the dielectric fill material 234). In some examples, the conformal dielectric material 232 is silicon nitride, and the dielectric fill material 234 is silicon oxide.

In FIG. 24, the dielectric layers 204 are pulled back from the opening 228 to the respective semiconductor layers 210 to form lateral recesses 236 from the opening 228. The pull back process can be any appropriate isotropic etch that selectively etches the dielectric layers 204. For example, when the dielectric layers 204 are silicon oxide, a hydrofluoric acid based process (e.g., a wet dHF or a dry HF process) can be used to etch the dielectric layers 204.

The semiconductor layers 210 are doped at vertical sidewall surfaces of the semiconductor layers 210 at the respective lateral recesses 236 to form source regions 238. The source regions 238 can be doped with n-type dopants. The doping can be performed using a gas-phase dopant and/or a plasma assisted doping process.

In FIG. 25, the lateral recesses 236 are expanded to form enlarged lateral recesses 240. The expansion can include an isotropic etch that selectively etches the conformal dielectric material 232. The isotropic etch can be a wet or dry process. In some examples where the conformal dielectric material 232 is silicon nitride, a hot phosphoric acid etch process or a dry plasma etch process can be used to etch the conformal dielectric material 232.

FIG. 26 shows the formation of capacitors in the enlarged lateral recesses 240. Each capacitor includes an outer plate 130, a capacitor dielectric layer 132, and an inner plate 134, like described above with respect to FIG. 11.

In FIG. 27, a drain region 242, a barrier layer 140, and a conductive fill material 142 are formed. An opening is formed through the dielectric fill material 226. The opening exposes vertical sidewalls of the semiconductor layers 210. An etch process can be used to form the opening and expose the vertical sidewalls of the semiconductor layers 210. For example, the etch process can include an anisotropic etch and/or an isotropic etch. The gate dielectric layers 220 that were previously formed on the vertical sidewalls of the semiconductor layers 210 are removed by the etch process to expose the vertical sidewalls of the semiconductor layers 210.

Lateral portions of the semiconductor layers 210 at respective vertical sidewalls exposed by the opening are doped to form drain regions 242. The drain regions 242 can be doped with n-type dopants. The doping can be performed using a gas-phase dopant and/or a plasma assisted doping process. With the drain regions 242 formed, a respective transistor is formed for the DRAM cells. For each DRAM cell, the transistor includes the source region 238 in the semiconductor layer 210, the drain region 242 in the semiconductor layer 210, a channel region in the semiconductor layer 210 between the source region 238 and the drain region 242, a first (e.g., top) gate structure disposed on and over the semiconductor layer 210 aligned over the channel region, and a second (e.g., bottom) gate structure disposed on and below the semiconductor layer 210 aligned over the channel region. Each of the first gate structure and the second gate structure includes a respective gate dielectric layer 220 and a respective gate electrode fill material 224.

The barrier layer 140 and conductive fill material 142 are then formed in the opening, like described with respect to FIG. 12. The barrier layer 140 and the conductive fill material 142 generally form a contact, which may be a bitline node of the DRAM cells. This contact is along a vertical axis around which mirrored DRAM pairs are mirrored.

FIGS. 28 through 40 are cross-sectional views of intermediate structures during a third method to form 3D DRAM cells according to some examples of the present disclosure. The 3D DRAM cells formed according to the third method of FIGS. 28 through 40 can be like shown in FIG. 3.

Figure 28:
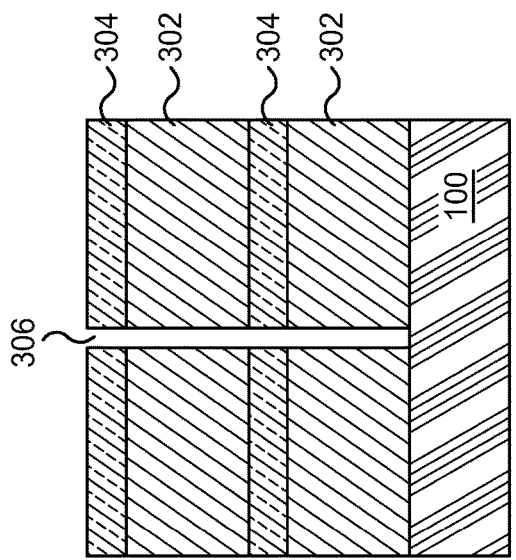

Referring to FIG. 28, a film stack is deposited on a substrate 100. The film stack includes multiple unit stacks (e.g., two unit stacks in the illustrated example) that are, in part, used sacrificially to form 3D DRAM cells. As will become apparent, this method forms two layers of 3D DRAM cells. In other examples, repeating the unit stacks of the film stack can enable forming additional layers of 3D DRAM cells. Also, using one instance of the unit stacks in the film stack can enable forming one layer of 3D DRAM cells.

The film stack includes multiple unit stacks, where a unit stack includes a sacrificial layer 302 and a semiconductor layer 304. The unit stack of the film stack is or consists of a sacrificial layer 302 and a semiconductor layer 304 on the sacrificial layer 302. Two instances of this unit stack are stacked on the substrate 100 in FIG. 28. The sacrificial layers 302 can each be a same material, and the semiconductor layers 304 can each be a same material that is different from and has etch selectivity between the material of the sacrificial layers 302. Generally, the materials of the different layers permit selectively etching targeted layers during processing, as will become apparent. The film stack is used as a mold for forming the DRAM cells. In some examples, the sacrificial layers 302 are silicon germanium, silicon oxide, doped silicon oxide, BPSG, BSG, PSG, or silicon nitride, and the semiconductor layers 304 are silicon (e.g., amorphous, polycrystalline, or monocrystalline, which may be doped) or InGaZnO. In some specific examples, the sacrificial layers 302 are amorphous or crystalline silicon germanium, and the semiconductor layers 304 are amorphous or crystalline silicon. Each layer of the sacrificial layers 302 and semiconductor layers 304 can be deposited by any appropriate deposition technique, such as CVD, PVD, or the like.

In some examples, the sacrificial layers 302 and semiconductor layers 304 are semiconductor materials, and further, are epitaxial or crystalline (e.g., monocrystalline) semiconductor materials. In some examples, the film stack can be formed by epitaxially growing the sacrificial layer 302 on the substrate 100, epitaxially growing the semiconductor layer 304 on the sacrificial layer, and repeatedly epitaxially growing a sacrificial layer 302 and semiconductor layer 304 to implement a target number of layers in the film stack. Using an epitaxial or crystalline (e.g., monocrystalline) material, such as silicon germanium, as the sacrificial layers 302 can permit depositing the sacrificial layers 302 and semiconductor layers 304 by epitaxial growth, which permits the semiconductor layers 304 (and as will become apparent, active regions including source/drain regions and channel regions of the transistors) to be crystalline (e.g., monocrystalline). In some specific examples, the sacrificial layers 302 are epitaxial or crystalline (e.g., monocrystalline) silicon germanium, and the semiconductor layers 304 are epitaxial or crystalline (e.g., monocrystalline) silicon.

Figure 29:
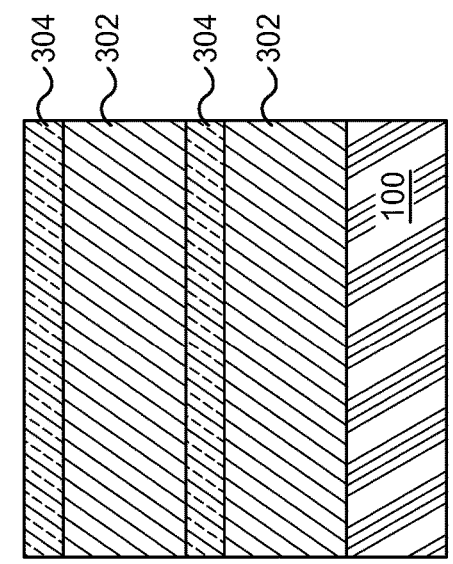

In FIG. 29, an opening 306 is formed through the film stack (e.g., through the sacrificial layers 302 and semiconductor layers 304). The opening 306 can be formed using an anisotropic etch, such as a RIE or the like.

Figure 30:
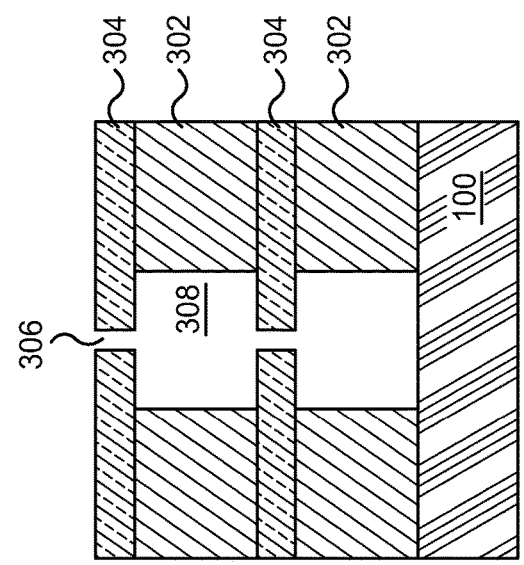

In FIG. 30, the sacrificial layers 302 are pulled back from the opening 306 to form lateral recesses 308 from the opening 306. The pull back process can be any appropriate isotropic etch that selectively etches the sacrificial layers 302. For example, when the sacrificial layers 302 are silicon germanium, a mixture of hydrofluoric acid (HF), hydrogen peroxide ($H_2O_2$), and acetic acid ($CH_3COOH$) at a ratio of 1:2:3 ($HF:H_2O_2:CH_3COOH$) can be used to etch the sacrificial layers 302.

Figure 31:
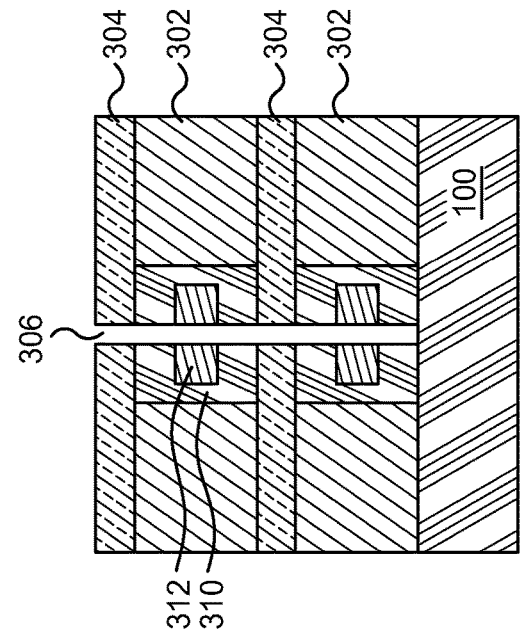

FIG. 31 illustrates a conformal sacrificial material 310 and a dielectric fill material 312. The conformal sacrificial material 310 can be formed using a conformal deposition, such as ALD, that conformally deposits the material of the conformal sacrificial material 310 along surfaces that define the opening 306 and lateral recesses 308 (e.g., vertical sidewalls of the sacrificial layers 302 and exposed surfaces of the semiconductor layers 304). The dielectric fill material 312 can be deposited on the conformally deposited material of the conformal sacrificial material 310 by any appropriate deposition, such as by ALD, FCV, or the like, to fill the remaining unfilled portions of the opening 306 and lateral recesses 308. An anisotropic etch can be used to remove the material of the conformal sacrificial material 310 and the dielectric fill material 312 from between sidewalls of, e.g., the semiconductor layers 304 that define the opening 306. The conformal sacrificial material 310 can be any sacrificial material, such as a sacrificial dielectric material, and the dielectric fill material 312 can be any dielectric material. In some examples, the conformal sacrificial material 310 is silicon nitride, and the dielectric fill material 312 is silicon oxide.

In FIG. 32, lateral portions of the conformal sacrificial material 310 are pulled back from the opening 306 to form lateral recesses 314 from the opening 306. The dielectric fill material 312 formed on a respective conformal sacrificial material 310 can remain disposed vertically between the lateral recesses 314 formed by pulling back the respective conformal sacrificial material 310. The pull back process can be any appropriate isotropic etch that selectively etches the conformal sacrificial material 310. For example, when the conformal sacrificial material 310 is silicon nitride, a hot phosphoric acid etch process can be used to pull back the conformal sacrificial material 310.

FIG. 33 illustrates gate dielectric layers 220, gate barrier/tuning layers 222, gate electrode fill material 224, and dielectric fill material 226. The gate dielectric layers 220, gate barrier/tuning layers 222, and gate electrode fill material 224 are formed in the lateral recesses 314 like described above with respect to FIG. 20, and dielectric fill material 226 is formed in the opening 306 like described above with respect to FIG. 20.

In FIG. 34, openings 315 are formed through the film stack (e.g., through the sacrificial layers 302 and semiconductor layers 304), like described above with respect to FIG. 21. As will become apparent, each opening 315 is used in the formation of capacitors that will be electrically connected to respective transistors, of which the gate electrode fill material 224 and gate barrier/tuning layers 222 are a part. Each opening 315 is disposed some lateral distance from the corresponding gate electrode fill material 224 and gate barrier/tuning layers 222, with the corresponding gate electrode fill material 224 and gate barrier/tuning layers 222 disposed laterally between the respective opening 315 and where the opening 306 was formed (e.g., which is filled by the dielectric fill material 226).

In FIG. 35, the sacrificial layers 302 are pulled back from the respective openings 315 to form lateral recesses 316 from the respective openings 315. In some examples, the sacrificial layers 302 are removed by the pull back process. In some examples, such as illustrated, the pull back process can also remove the conformal sacrificial material 310, such as when the sacrificial layers 302 and conformal sacrificial material 310 are a same material The pull back process can be any appropriate isotropic etch that selectively etches the sacrificial layers 302. For example, when the sacrificial layers 302 are silicon germanium, a mixture of HF, $H_2O_2$, and $CH_3COOH$ at a ratio of 1:2:3 (HF:$H_2O_2$:$CH_3COOH$) can be used to pull back the sacrificial layers 302.

FIG. 36 illustrates a conformal dielectric material 232 and a dielectric fill material 234 formed in the lateral recesses 316. The conformal dielectric material 232 and dielectric fill material 234 can be formed like described above with respect to FIG. 23.

In FIG. 37, the semiconductor layers 304 are pulled back from the opening 315 to form lateral recesses 318 from the opening 315. The pull back process can be any appropriate isotropic etch that selectively etches the semiconductor layers 304. For example, when the semiconductor layers 304 are silicon, a TMAH etch process or dry plasma isotropic etch can be used to pull back the semiconductor layers 304.

The semiconductor layers 304 are doped at vertical sidewall surfaces of the semiconductor layers 304 at the respective lateral recesses 318 to form source regions 238, like described with respect to FIG. 24.

In FIG. 38, the lateral recesses 318 are expanded to form enlarged lateral recesses 240, like described with respect to FIG. 25. FIG. 39 shows the formation of capacitors in the enlarged lateral recesses 240. Each capacitor includes an outer plate 130, a capacitor dielectric layer 132, and an inner plate 134, like described above with respect to FIG. 11. In FIG. 40, a drain region 242, a barrier layer 140, and a conductive fill material 142 are formed like described with respect to FIG. 27.

With the drain regions 242 formed, a respective transistor is formed for the DRAM cells. For each DRAM cell, the transistor includes the source region 238 in the semiconductor layer 304, the drain region 242 in the semiconductor layer 304, a channel region in the semiconductor layer 304 between the source region 238 and the drain region 242, a first (e.g., top) gate structure disposed on and over the semiconductor layer 304 aligned over the channel region, and a second (e.g., bottom) gate structure disposed on and below the semiconductor layer 304 aligned over the channel region. Each of the first gate structure and the second gate structure includes the gate dielectric layer 220 and the gate electrode fill material 224. The barrier layer 140 and the conductive fill material 142 generally form a contact, which may be a bitline node of the DRAM cells. This contact is along a vertical axis around which mirrored DRAM pairs are mirrored.

While the foregoing is directed to various examples of the present disclosure, other and further examples may be devised without departing from the basic scope thereof, and the scope thereof is determined by the claims that follow.

The invention claimed is:

1. A method for semiconductor processing, the method comprising:

forming a film stack on a substrate, the film stack comprising multiple unit stacks, each unit stack having a first dielectric layer, a semiconductor layer disposed on the first dielectric layer, and a second dielectric layer disposed on the semiconductor layer;

forming a first opening through the film stack;

pulling back the second dielectric layer from the first opening to form a first lateral recess;

forming a gate structure in the first lateral recess and disposed on a portion of the semiconductor layer;

forming a second opening through the film stack, the second opening being laterally disposed from where the first opening was formed, the gate structure being disposed laterally between the second opening and where the first opening was formed;

pulling back the portion of the semiconductor layer from the second opening to form a second lateral recess;

expanding the second lateral recess comprising removing at least some of the first dielectric layer below the second lateral recess and at least some of the second dielectric layer above the second lateral recess; and forming a capacitor in the expanded second lateral recess, the capacitor contacting the portion of the semiconductor layer.

2. The method of claim 1, wherein forming the capacitor comprises:

conformally depositing a first plate along surfaces of the expanded second lateral recess;

conformally depositing a capacitor dielectric layer along the first plate; and depositing a second plate on the capacitor dielectric layer.

3. The method of claim 1 further comprising forming a source/drain region in the portion of the semiconductor layer comprising doping the portion of the semiconductor layer through the second lateral recess, wherein a plate of the capacitor is formed contacting the source/drain region in the portion of the semiconductor layer.

4. The method of claim 1 further comprising:

forming a source/drain region in the portion of the semiconductor layer comprising doping the portion of the semiconductor layer; and forming a contact extending through the film stack, the contact contacting the source/drain region.

5. A method for semiconductor processing, the method comprising:

forming a film stack on a substrate, the film stack comprising multiple unit stacks, each unit stack having a first layer and a second layer disposed on the first layer;

forming a first opening through the film stack;

pulling back the first layer from the first opening to form a first lateral recess;

forming a first conformal layer in the first lateral recess;

forming a first fill material on the first conformal layer and in the first lateral recess;

pulling back the first conformal layer from the first opening to form a second lateral recess;

forming a gate structure in the second lateral recess and disposed on and below the second layer;

forming a second opening through the film stack, the second opening being laterally disposed from where the first opening was formed, the gate structure being disposed laterally between the second opening and where the first opening was formed;

pulling back the second layer from the second opening to form a third lateral recess; and forming a capacitor in the third lateral recess was disposed.

6. The method of claim 5 further comprising:

pulling back the second layer from the second opening to form a fourth lateral recess being horizontally aligned with the second layer; and forming a source region in the second layer from the fourth lateral recess, the source region contacting the capacitor.

7. The method of claim 5, wherein the first layer is a first dielectric material, and the second layer is a second dielectric material, the first dielectric material and the second dielectric material being selectively removable relative to each other.

8. The method of claim 5, wherein the first layer is a first dielectric material, and the second layer is a second dielectric material different from the first dielectric material, each of the first dielectric material and the second dielectric material being selected from a group consisting of silicon nitride, silicon oxide, doped silicon oxide, borophosphosilicate glass (BPSG), and phosphosilicate glass (PSG).

9. The method of claim 5, wherein forming the film stack comprises:
epitaxially growing the first layer; and
epitaxially growing the second layer on the first layer.

10. The method of claim 5, wherein the first layer is silicon germanium, and the second layer is silicon.

11. The method of claim 5, wherein the first layer is epitaxial silicon germanium, and the second layer is epitaxial silicon.

12. The method of claim 5, wherein the first layer is amorphous silicon germanium, and the second layer is amorphous silicon.

13. The method of claim 5, wherein the first layer is a first semiconductor material, and the second layer is a second semiconductor material different from the first semiconductor material.

14. The method of claim 13, wherein the first semiconductor material and the second semiconductor material are amorphous.

15. The method of claim 13, wherein the first semiconductor material and the second semiconductor material are epitaxial or monocrystalline.

16. The method of claim 5 further comprising:
pulling back the first layer from the second opening to form a fourth lateral recess;
forming a second conformal layer in the fourth lateral recess; and
forming a second fill material on the second conformal layer and in the fourth lateral recess.

17. The method of claim 16 further comprising expanding the third lateral recess comprising removing at least some of the second conformal layer, the capacitor being formed in the expanded third lateral recess.

18. A method for semiconductor processing, the method comprising:
forming a film stack on a substrate, the film stack comprising at least five layers, each layer of the at least five layers being formed of a material selected from a group of materials including no more than three different materials; and
using the film stack as a mold, forming vertically stacked mirrored DRAM pairs on the substrate, each mirrored DRAM pair of the vertically stacked mirrored DRAM pairs comprising:
a contact;
a first transistor comprising a first gate structure, a first source/drain region, and a second source/drain region, the first source/drain region contacting the contact;
a second transistor comprising a second gate structure, a third source/drain region, and a fourth source/drain region, the third source/drain region contacting the contact, the second transistor mirroring the first transistor around the contact;
a first capacitor having a first outer plate, a first capacitor dielectric layer, and a first inner plate, the first outer plate contacting the second source/drain region; and
a second capacitor having a second outer plate, a second capacitor dielectric layer, and a second inner plate, the second outer plate contacting the fourth source/drain region.

\* \* \* \* \*